(12) United States Patent
Shimanouchi et al.

(10) Patent No.: US 9,178,542 B1
(45) Date of Patent: Nov. 3, 2015

(54) METHODS AND APPARATUS FOR ACCURATE TRANSMITTER SIMULATION FOR LINK OPTIMIZATION

(71) Applicant: ALTERA CORPORATION, San Jose, CA (US)

(72) Inventors: Masashi Shimanouchi, San Jose, CA (US); Peng Li, Palo Alto, CA (US); Hsinho Wu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/548,606

(22) Filed: Nov. 20, 2014

(51) Int. Cl.
*H04L 25/49* (2006.01)
*H04B 1/04* (2006.01)
*H04L 25/03* (2006.01)

(52) U.S. Cl.
CPC ........ *H04B 1/0475* (2013.01); *H04L 25/03012* (2013.01)

(58) Field of Classification Search
CPC .............. H03G 1/3247; H04L 27/368; H04L 25/03343
USPC ......................... 375/296, 350, 376; 455/196.3
See application file for complete search history.

(56) References Cited

U.S. PATENT DOCUMENTS

| | | |
|---|---|---|
| 6,862,618 B1 | 3/2005 | Gray et al. |
| 7,693,691 B1 | 4/2010 | Tao et al. |
| 8,566,073 B2 | 10/2013 | Dou et al. |
| 8,626,474 B2 | 1/2014 | Li et al. |
| 8,817,815 B2 | 8/2014 | Chidambaram et al. |
| 2009/0186587 A1* | 7/2009 | Sobchak et al. ........... 455/196.1 |
| 2010/0103839 A1 | 4/2010 | Swenson et al. |
| 2013/0195216 A1* | 8/2013 | Nakasha et al. .............. 375/295 |
| 2013/0218538 A1 | 8/2013 | Fuecker et al. |
| 2013/0332101 A1 | 12/2013 | Pickerd et al. |

* cited by examiner

*Primary Examiner* — Khai Tran
(74) *Attorney, Agent, or Firm* — Okamoto & Benedicto LLP

(57) ABSTRACT

One embodiment relates to an apparatus for generating a data output signal. The apparatus includes a pre-emphasis filter and an edge-shape filter. The edge-shape filter includes a non-linearity correction stage that applies a non-linearity correction and a linear filter that applies linear filtering. Another embodiment relates to a method of generating tap coefficients for a pre-emphasis filter. A summation of products of tap coefficients and time-shifted base single-bit response waveforms is used to form a first waveform, and a measured single-bit response waveform is used to provide a second waveform. The tap coefficients are adjusted to fit the first waveform to the second waveform. Other embodiments, aspects, and features are also disclosed.

21 Claims, 13 Drawing Sheets

METHODS AND APPARATUS FOR ACCURATE TRANSMITTER SIMULATION FOR LINK OPTIMIZATION

BACKGROUND

1. Technical Field

The present invention relates generally to data communication links. More particularly, the present invention relates to transmitter optimization for data communication links.

2. Description of the Background Art

High-speed serial interfaces may be used to communicate data between devices in a system. Such serial interfaces may provide a high data bandwidth across backplanes or between chip devices.

However, problems and issues are faced due to the high-speed signaling that may be used by these serial interfaces. One problem relates to frequency-dependent transmission signal losses, which may be caused by skin effect and dielectric loss. This transmission signal loss may cause greater attenuation of the high-frequency component of these signals, making it problematic for the receiver to accurately interpret the data signal. This may lead to a higher bit error rate (BER).

The frequency dependent loss may become severe and various equalizations may need to be invoked to compensate the high-frequency signal loss. Commonly used equalization techniques may include linear equalization and non-linear adaptive equalization. Examples of linear equalization include finite impulse response (FIR) filtering and feed forward equalization (FFE). An example of nonlinear adaptive equalization is decision feedback equalization (DFE).

SUMMARY

One embodiment relates to an apparatus for generating a data output signal. The apparatus includes a pre-emphasis filter and an edge-shape filter. The edge-shape filter includes a non-linearity correction stage that applies a non-linearity correction and a linear filter that applies linear filtering.

Another embodiment relates to a method for generating a data output signal. An input data signal is received by a pre-emphasis filter, which outputs a pre-emphasized signal. The pre-emphasized signal is received by an edge-shape filter, which outputs an edge-shaped signal. A non-linearity correction stage in the edge-shape filter applies a non-linearity correction to the pre-emphasized signal and outputs a non-linearity-corrected signal. A linear filter in the edge-shape filter applies linear filtering to the non-linearity-corrected signal and outputs the edge-shaped signal. The edge-shaped signal is received by a driver, which generates the data output signal.

Another embodiment relates to a method of generating tap coefficients for a pre-emphasis filter. A summation of products of tap coefficients and time-shifted base single-bit response waveforms is used to form a first waveform, and a measured single-bit response waveform is used to provide a second waveform. The tap coefficients are adjusted to fit the first waveform to the second waveform. Other embodiments, aspects, and features are also disclosed.

Another embodiment relates to a system for simulation of a high-speed data link. The system includes at least one processor for executing computer-readable program code and a data storage system configured to store computer-readable program code and data. The computer-readable program code generates a first waveform from a summation of products of tap coefficient and time-shifted base single-bit response waveforms and a second waveform from a measured single-bit response waveform. The tap coefficients are adjusted so as to fit the first waveform to the second waveform.

DETAILED DESCRIPTION

Figure 1:
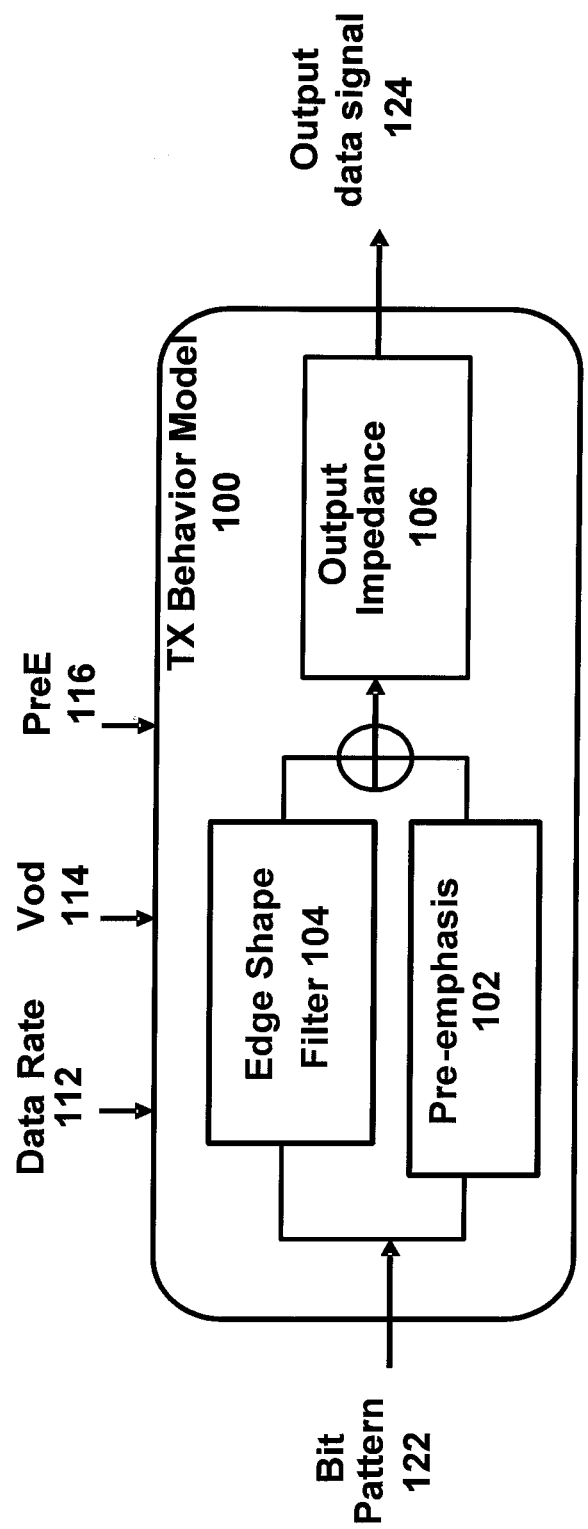
FIG. 1 depicts components and parameters of a transmitter behavior model in accordance with an embodiment of the invention.

For a high-speed serial link, the dominant contributors to overall system BER include jitter and noise from all the subsystems of the link. In order to ensure interoperability, many high-speed link standards specify the signal waveform, eye diagram, jitter, and noise properties at the output of the transmitter and also specify the inputs of the receiver. In order to be certain that a device will work well when it is integrated and used in a system, a device may be simulated to verify that it passes the specification requirements.

A transistor-level circuit simulator, such as HSPICE, may be used to simulate the operation of integrated circuits. The time to simulate an integrated circuit with a transistor-level circuit simulator, however, may be very long, such that the simulation becomes somewhat impractical. Transistor-level circuit simulation may take several hours or days to simulate transceiver circuit blocks with a data pattern which is of moderate length. For example, a transistor-level circuit simulator may take many days to simulate transceiver circuit with a pseudorandom binary sequence (PRBS) of length $(2^{15}-1)$ bits (which may be referred to as PRBS-15). A PRBS-15 data pattern is tens of thousands of bits long.

In order to reduce simulation time with increased coverage of the transceiver building blocks, a behavior-level simulator may be used. Behavior-level simulators include, for example, pre-emphasis and equalization link estimator (PELE), jitter, noise and eye simulator (JNEye) and other behavior-level simulators. A conventional behavior-level simulator takes minutes to hours to simulate the performance of a high-speed serial link, including, for example, transceiver circuits and the channel medium (e.g., PCB trace, connectors, vias) in between, so as to determine a simulated eye diagram and BER for a moderate length data pattern.

While transistor-level circuit simulation and waveform behavior-level simulation may be used for transceiver circuit simulation with moderate-length data patterns, it is not feasible to use transistor-level circuit simulation and waveform behavior-level simulation for substantially longer data patterns, such as a PRBS31 data pattern, which is a PRBS of length $(2^{31}-1)$ bits. A PRBS-31 data pattern is over a billion bits long and so would take a very long time to simulate. In addition, simulating a very long data pattern, such as PRBS-31, may be beyond the limited memory capabilities of the computer apparatus performing the simulation.

Another challenge in the simulation of high-speed links is how to obtain channel information. For example, channel S-parameters are usually measured by vector network analyzer (VNA), or simulated by an electromagnetic (EM) field solver. However, once network systems are deployed, the actual channels cannot be measured by VNA. Deployed channel information, such as an impulse or step response, may instead be measured with an embedded instrument, such as on-die instrument (ODI). If the channel information is given, then behavior-level simulation, such as using JNEye, may be useful to fine-tune adaptively obtained channel equalizer settings, such as, for example, TX pre-emphasis, RX continuous-time linear equalization (CTLE) and DFE.

The present disclosure provides methods and apparatus which advantageously address transmitter simulation challenges for optimizing high-speed serial links. Waveform behavior model structures are disclosed which very accurately model a transmitter for a high-speed serial link. In addition, a method is disclosed for obtaining the model parameters with high accuracy.

Prior techniques are generally limited to idealistic linear modeling and simple non-scalable non-linear modeling. In contrast, the present disclosure provides a scalable non-linear modeling technique.

The presently-disclosed technique provides for more accurate transmitter output waveforms under various link configurations. For example, the link configuration may vary as to the voltage output differential (Vod), data rate, pre-emphasis setting, and data bit pattern. The model architectures disclosed herein may be tailored to different device architectures, and the method by which model parameters are obtained may be performed time-efficiently.

The presently-disclosed technique provides a common methodology to obtain model parameters from both pre-silicon circuit simulation and post-silicon physical measurement. This common methodology advantageously enables seamless model accuracy improvement over time.

The presently-disclosed technique provides for automated single-bit response (SBR) based measurement/estimation of tap coefficients. This measurement/estimation of tap coefficients has a scientifically-derived basis and provides high repeatability and accuracy.

The presently-disclosed technique provides for the use to two different types of bit patterns, step responses and pseudo-random binary sequences, to obtain the pre-emphasis tap coefficients. Use of two different types of bit patterns advantageously provides more insight into device behavior and better correlation for specific conditions.

FIG. 1 depicts components and parameters of a transmitter behavior model 100 in accordance with an embodiment of the invention. As shown, the components may include a pre-emphasis filter 102, an edge shape filter 104, and output impedance 106. Parameters input into the TX behavior model 100 include the data rate 112, voltage output differential (Vod) 114, and pre-emphasis (PreE) setting 116.

A data bit pattern 122 is input and operated upon by the pre-emphasis filter 102 and the edge shape filter 104. The resultant data signal may then go through the output impedance 106 and is output as an output data signal 124.

Figure 2:
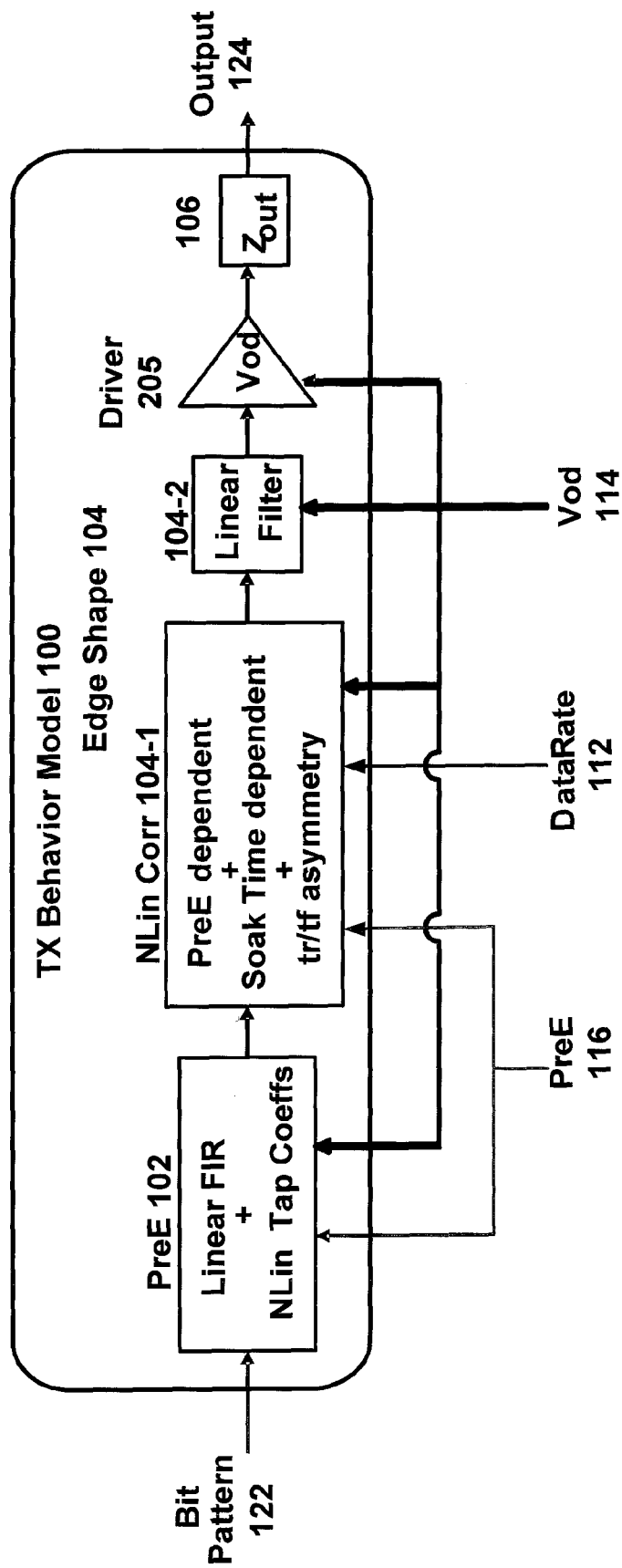
FIG. 2 depicts an exemplary structure of a transmitter behavior model in accordance with an embodiment of the invention.

FIG. 2 depicts an exemplary structure of the TX behavior model 100 in accordance with an embodiment of the invention. In comparison to FIG. 1, further detail of the TX behavior model 100 is shown in FIG. 2.

The data bit pattern 122 may be first received by the pre-emphasis (PreE) filter 102. As indicated, the parameters used by the pre-emphasis filter 102 include user-specified pre-emphasis (PreE) levels 116 and the Vod 114.

In accordance with an embodiment of the invention, the pre-emphasis filter 102 may be a linear finite impulse response (Linear FIR) filter that uses non-linearity tap coefficients (NLin Tap Coeffs). The pre-emphasis filter 102 may be implemented with as a current mode driver or as a voltage mode driver.

In one exemplary implementation, the pre-emphasis filter 102 may be implemented as a current mode driver that applies the following FIR formula.

$$y(n) = x(n) + C_{pre\_p} \times \frac{x(n) - x(n+1)}{2} - C_{pre\_n} \times \frac{x(n) + x(n+1)}{2} + C_{pos1\_p} \times \frac{x(n) - x(n-1)}{2} - C_{pos1\_n} \times \frac{x(n) + x(n-1)}{2} + C_{pos2\_p} \times \frac{x(n) - x(n-2)}{2} - C_{pos2\_n} \times \frac{x(n) + x(n-2)}{2} = \left[1 + \frac{C_{pre\_p} - C_{pre\_n}}{2} + \frac{C_{pos1\_p} - C_{pos1\_n}}{2} + \frac{C_{pos2\_p} - C_{pos2\_n}}{2}\right] \times x(n) - \frac{C_{pre\_p} + C_{pre\_n}}{2} \times x(n+1) - \frac{C_{pos1\_p} + C_{pos1\_n}}{2} \times x(n-1) - \frac{C_{pos2\_p} + C_{pos2\_n}}{2} \times x(n-2)$$

Eqn. (1)

In the above Eqn. (1), the input data signal is x(n), and the output data signal is y(n). The tap coefficients are: $C_{pre\_p}$; $C_{pre\_n}$; $C_{pos1\_p}$; $C_{pos1\_n}$; $C_{pos2\_p}$; and $C_{pos2\_n}$. In Eqn.(1), pre_p and pre_n respectively indicate positive and negative polarity pre-taps, posts and pos1_n respectively indicate positive and negative polarity post 1 taps, and pos2_p and pos2_n respectively indicate positive and negative polarity post 2 taps.

In another exemplary implementation, the pre-emphasis filter 102 may be implemented as a voltage mode driver that applies the following FIR formula.

$$y(n) = \text{Vod\_max}\left[\left(\frac{\text{vod\_level}}{N} - \sum_{i=-1,-2,+1,+2} \frac{|C_i|}{2}\right)x(n) + \right.$$

Eqn. (2)

$$C_i = \frac{\text{ithTap\_Level}}{N} \qquad \sum_{i=-1,-2,+1,+2} \frac{C_i}{2} x(n-i) \Bigg]$$

where

In the above Eqn. (2), Vod_max may be obtained from a transistor-level circuit simulated step response result without pre-emphasis. The tap coefficients are $C_i$: i=−2, −1, +1 or +2.

The pre-emphasized data signal may be output from the pre-emphasis filter to the edge-shape filter 104. As depicted, the edge-shape filter 104 may include two stages: a non-linearity correction stage 104-1; and a linear filter stage 104-2.

The linear filter 104-2 may implement a linear model derived from a Vod-dependent step response. However, the linear filter 104-2 alone does not provide sufficient accuracy. This is because the edge transition waveform deviates from the linear-filter-predicted behavior with pre-emphasis. Hence, there is a need to apply non-linearity correction to achieve higher modeling accuracy.

As depicted, the non-linearity correction stage 104-1 may be applied before the linear filter stage 104-2. In accordance with an embodiment of the invention, the non-linearity correction stage 104-1 may include a pre-emphasis dependent (PreE Dependent) non-linearity correction, a soak time dependent (Soak Time dependent) non-linearity correction, and a rise time/fall time (tr/tf) asymmetry non-linearity correction.

The output from the edge-shape filter 104 may be received by a driver 205. In general, the driver 205 may be a current-mode driver or a voltage-mode driver. As driver, the driver 205 may receive Vod as a control parameter, and drive an output signal through the output impedance Zout 106, resulting in the output data signal 124.

Figure 3:
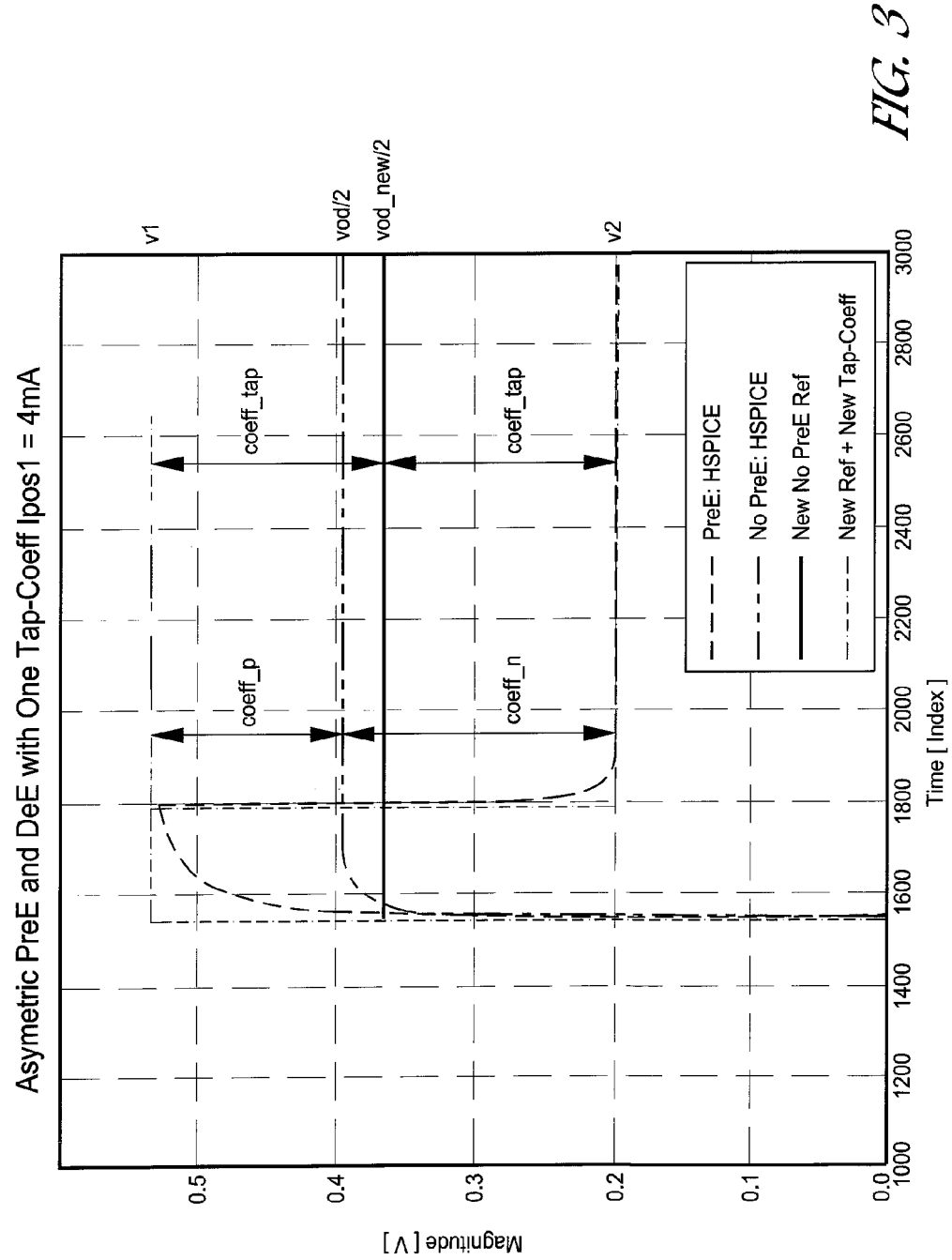
FIG. 3 depicts asymmetric boost (pre-emphasis) and attenuation (de-emphasis) applied at a data bit transition by a pre-emphasis filter in accordance with an embodiment of the invention.

FIG. 3 depicts asymmetric boost (pre-emphasis) and attenuation (de-emphasis) applied at a data bit transition by a pre-emphasis filter 102 in accordance with an embodiment of the invention. A reference data signal is shown that rises from a lower voltage level to a higher voltage level of Vod/2. The effect of the pre-emphasis filter 102 on the reference data signal is illustrated.

As depicted, the effect of the pre-emphasis filter provides both an initial boost and a subsequent de-emphasis to the voltage signal. As further depicted the initial boost may be to a voltage level V1, and the subsequent de-emphasis may be to a voltage level V2. In this case, the de-emphasis is implemented with a "post 1" (i.e. the one unit delay or $z^{-1}$) tap.

In accordance with an embodiment of the invention, the magnitude of the boost and de-emphasis may be asymmetric. For example, the boost may raise the voltage signal to V1=(1+coeff_p)*Vod/2, and the de-emphasis may lower the voltage signal to V2=(1−coeff_n)*Vod/2, where the positive-effect (boost) coefficient coeff_p does not equal to the negative-effect (de-emphasis) coefficient coeff_n. As such, there is asymmetry in that V1 and V2 are not symmetrically positioned above and below Vod/2.

As shown, there may be, in effect, a new reference voltage level Vod_new that is the average of V1 and V2. As such, V1 and V2 are symmetrically disposed above and below Vod_new. V1 and V2 may then be given by V1=(1+coeff_tap)*Vod_new/2 and V2=(1−coeff_tap)*Vod_new/2, where coeff_tap is the tap coefficient.

Figure 4:
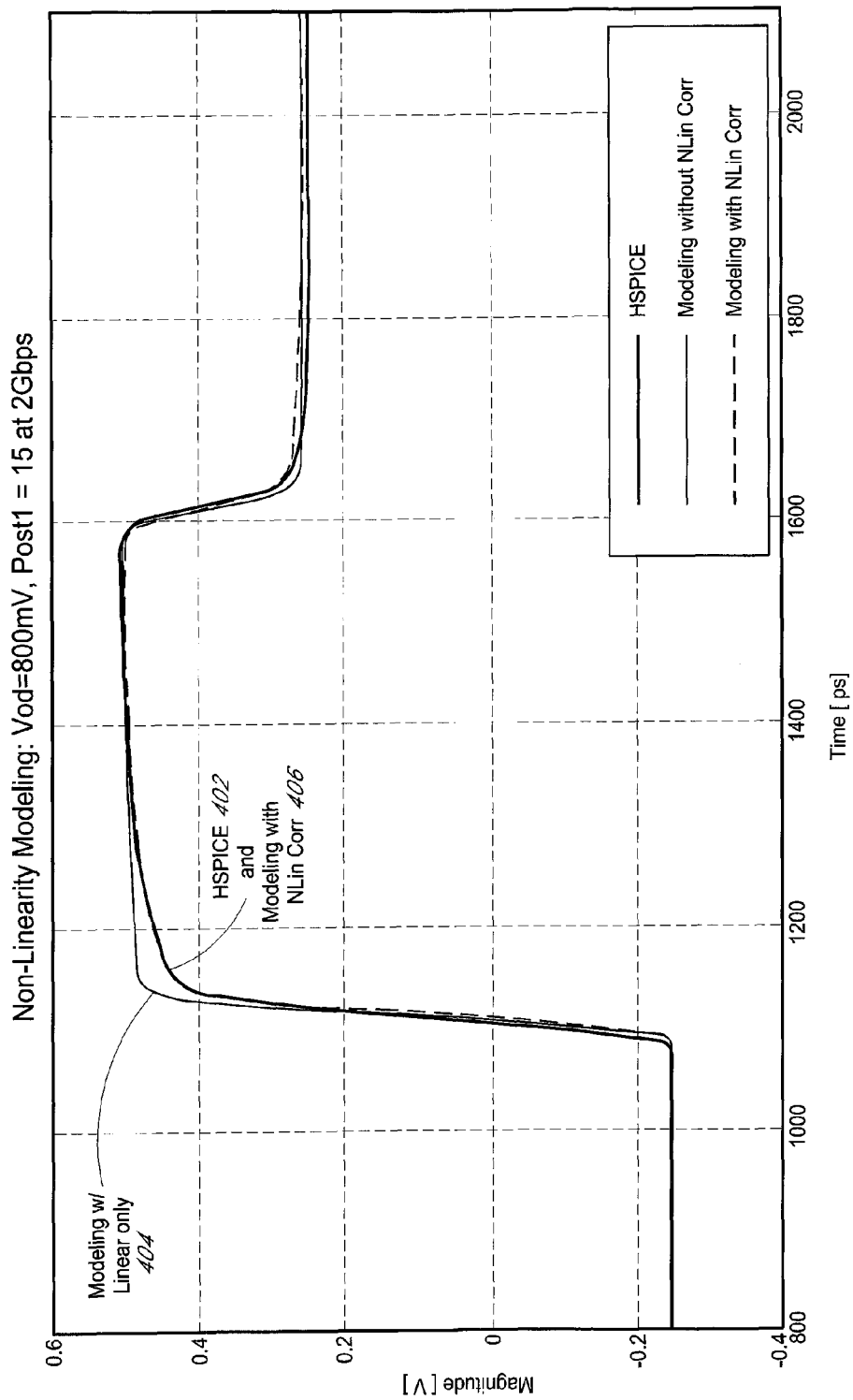
FIG. 4 depicts the need and effect of edge-shape non-linearity correction in accordance with an embodiment of the invention.
Figure 5:
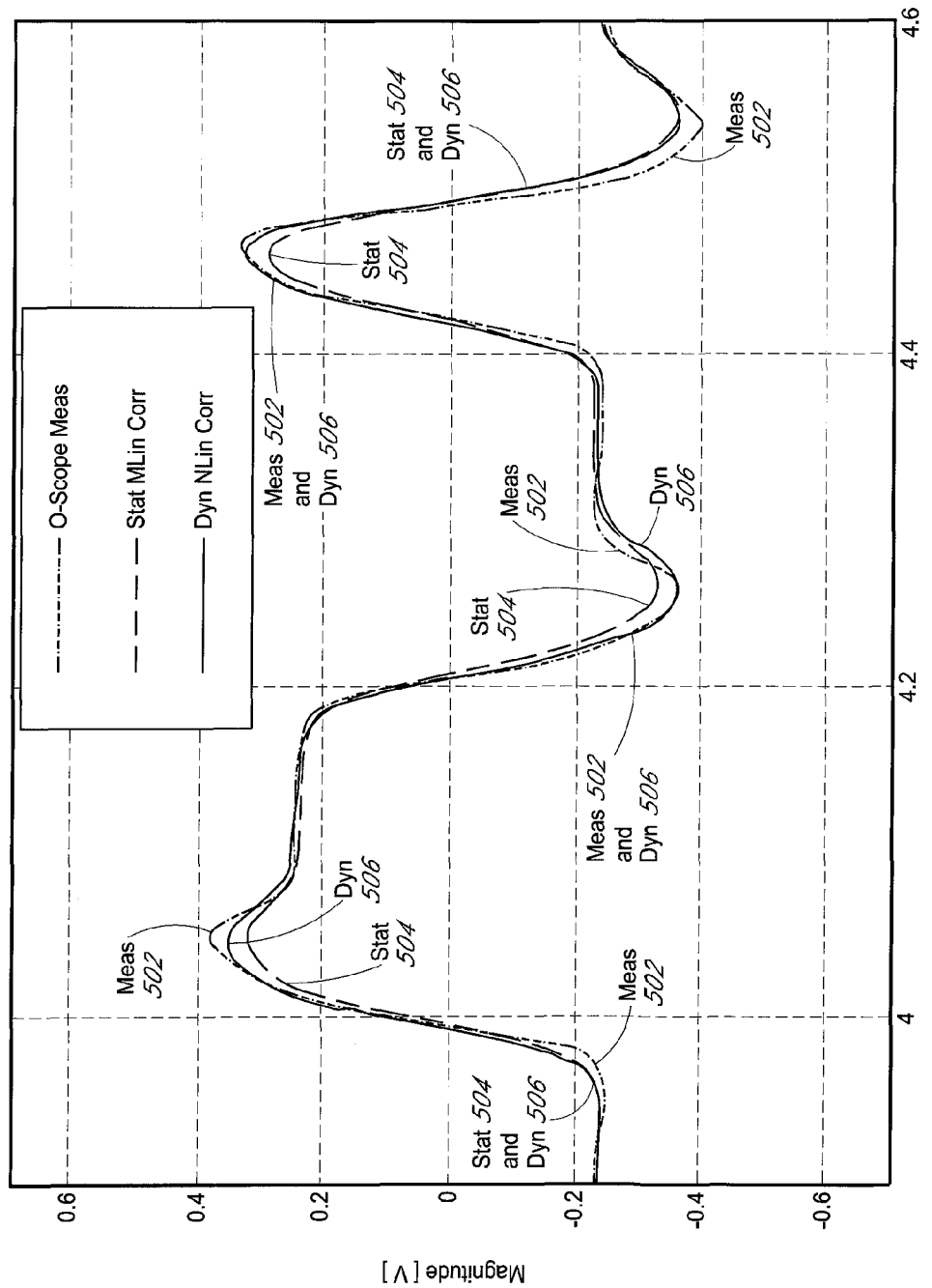
FIG. 5 depicts dynamic non-linearity correction which is soak-time dependent in accordance with an embodiment of the invention.
Figure 6:
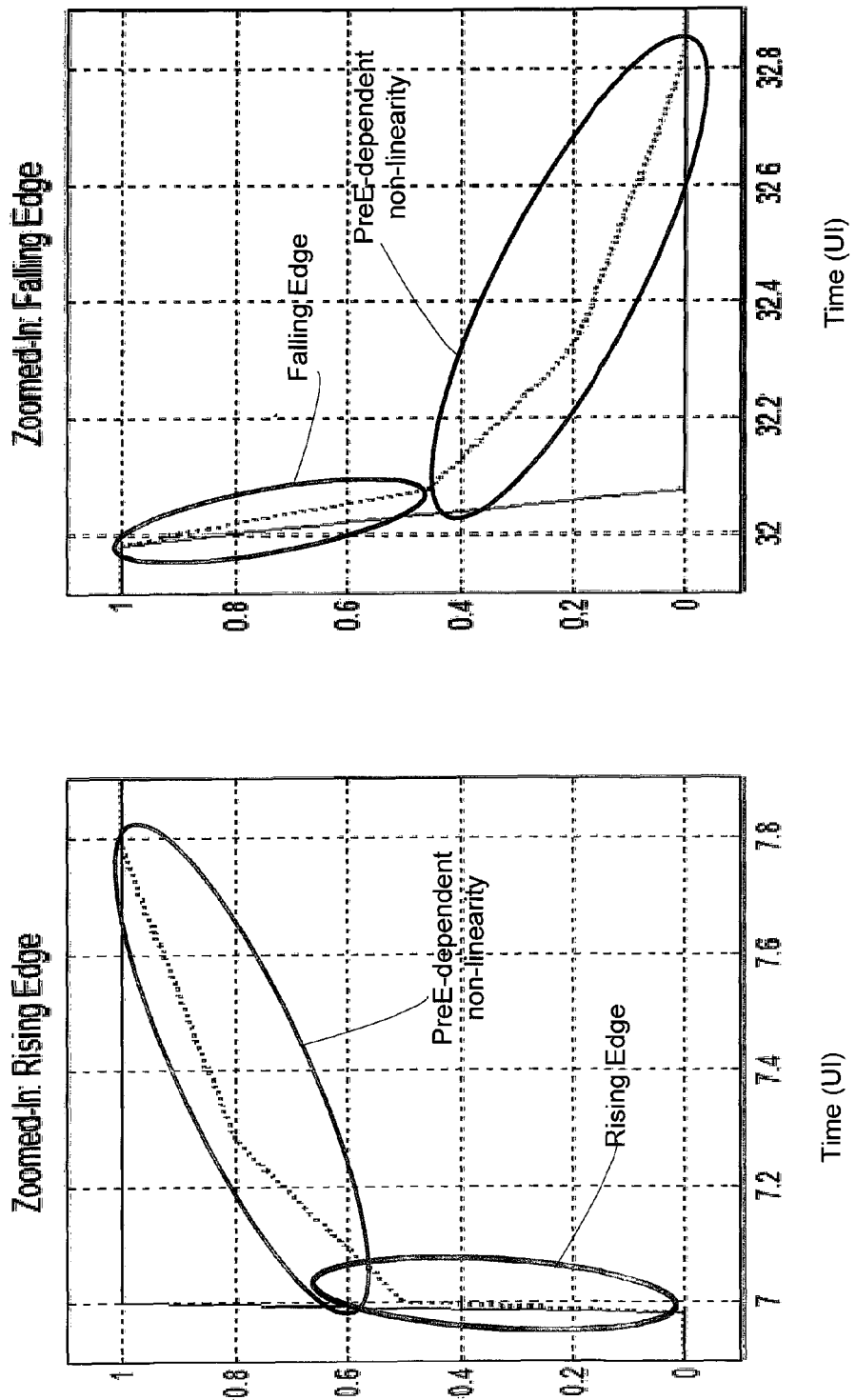
FIG. 6 depicts pre-emphasis-dependent and rise-time/fall-time asymmetry non-linearity correction in accordance with an embodiment of the invention.

As shown in FIG. 2, the output of the pre-emphasis filter 102 may be provided to the non-linearity correction stage 104-1 of the edge-shape filter 104. FIGS. 4-6 relate to non-linearity correction as applied by the non-linearity correction stage 104-1 in accordance with an embodiment of the invention. The need and effect of the non-linearity correction is described below in relation to FIG. 4. In accordance with an embodiment of the invention, the non-linearity correction stage 104-1 may apply a dynamic non-linearity correction which is soak-time dependent as described below in relation to FIG. 5. Furthermore, the non-linearity correction stage 104-1 may apply an asymmetric rise/fall time non-linearity correction as described below in relation to FIG. 6.

FIG. 4 depicts the need and effect of edge-shape non-linearity correction in accordance with an embodiment of the invention. The figure shows an edge transition waveform 402 of a data signal that is simulated using HSPICE. It is a goal of the edge shape modeling to reproduce this edge shape 402.

In a first step, the edge shape may be modeled using a linear filter 104-2 without non-linearity correction. The linear filter 104-2 may be obtained from a step response to cover a wide data range (for example, from 2 Gbps to 50 Gbps).

The linear-filter-predicted edge transition waveform 404 may then be compared against the simulated edge transition waveform 402. As shown, the linear-filter-predicted edge transition waveform 404 deviates from the simulated edge transition waveform 402.

Hence, in a second step, non-linearity correction may be applied to achieve higher accuracy modeling. The non-linearity correction may also include dynamic non-linearity correction, as described below in relation to FIG. 5. The non-linearity correction may also include pre-emphasis dependent and rise-time/fall-time asymmetry non-linearity correction, as described below in relation to FIG. 6. As shown in FIG. 4, the edge transition waveform modeled with non-linearity correction 406 closely follows the simulated edge transition waveform 402.

FIG. 5 depicts dynamic non-linearity correction which is soak-time dependent in accordance with an embodiment of the invention. Three waveforms are shown in FIG. 5. A first waveform is an edge transition waveform that is generated by a transmitter and measured by an oscilloscope (O-Scope Meas or Meas 502). A second waveform is an edge transition waveform that has static (and not dynamic) non-linearity correction (Stat NLin Corr or Stat 504). A third waveform is an edge transition waveform that has dynamic non-linearity correction (Dyn NLin Corr or Dyn 506).

As shown, there are deviations of the static non-linearity-corrected waveform 504 from the measured waveform 502. The dynamic non-linearity-corrected waveform 506 is substantially closer to (i.e. deviates substantially less from) the measured waveform 502.

In accordance with an embodiment of the invention, the non-linearity correction stage 104-1 may apply a dynamic non-linearity correction that is a soak-time dependent correction. The soak time is a function of data rate and data pattern and may be defined as the duration of a previous state (prior to the edge). In one implementation, the edge shape may be adjusted with a soak-time-dependent boost after the transition, where the amplitude of the boost depends on the soak time. A larger soak time may result in a larger amplitude boost, and a smaller soak time may result in a smaller amplitude boost. As shown in the example depicted in FIG. 5, the soak-time-dependent boost results in a dynamic non-linearity corrected waveform 506 that closely models the measured waveform 502.

FIG. 6 depicts pre-emphasis-dependent and rise-time/fall-time asymmetry non-linearity correction in accordance with an embodiment of the invention. The graph on the left is a zoomed-in view of a rising edge, and the graph on the right is a zoomed-in view of a falling edge.

As seen in FIG. 6, there is a pre-emphasis-dependent non-linearity in both the rising and falling edge shapes. This non-linearity depends on the pre-emphasis applied by the pre-emphasis filter 102. As discussed above in relation to FIG. 3, the pre-emphasis may modify an edge shape with both an initial boost and a subsequent attenuation. In accordance with an embodiment of the invention, the non-linearity correction stage 104-1 corrects this pre-emphasis-dependent non-linearity. For example, a post-edge boost which is dampened over time may be provided to compensate for the pre-emphasis-dependent non-linearity in FIG. 6.

As further seen in FIG. 6, there can be an asymmetry in the rising edge versus the falling edge. In accordance with an embodiment of the invention, the non-linearity correction stage 104-1 also introduces this asymmetry. For example, in FIG. 6, the rising edge is shown as steeper than the falling edge. In this case, the non-linearity correction stage 104-1 may apply a filter to decrease the steepness of the falling edge so as to increase the asymmetry.

Figure 7:
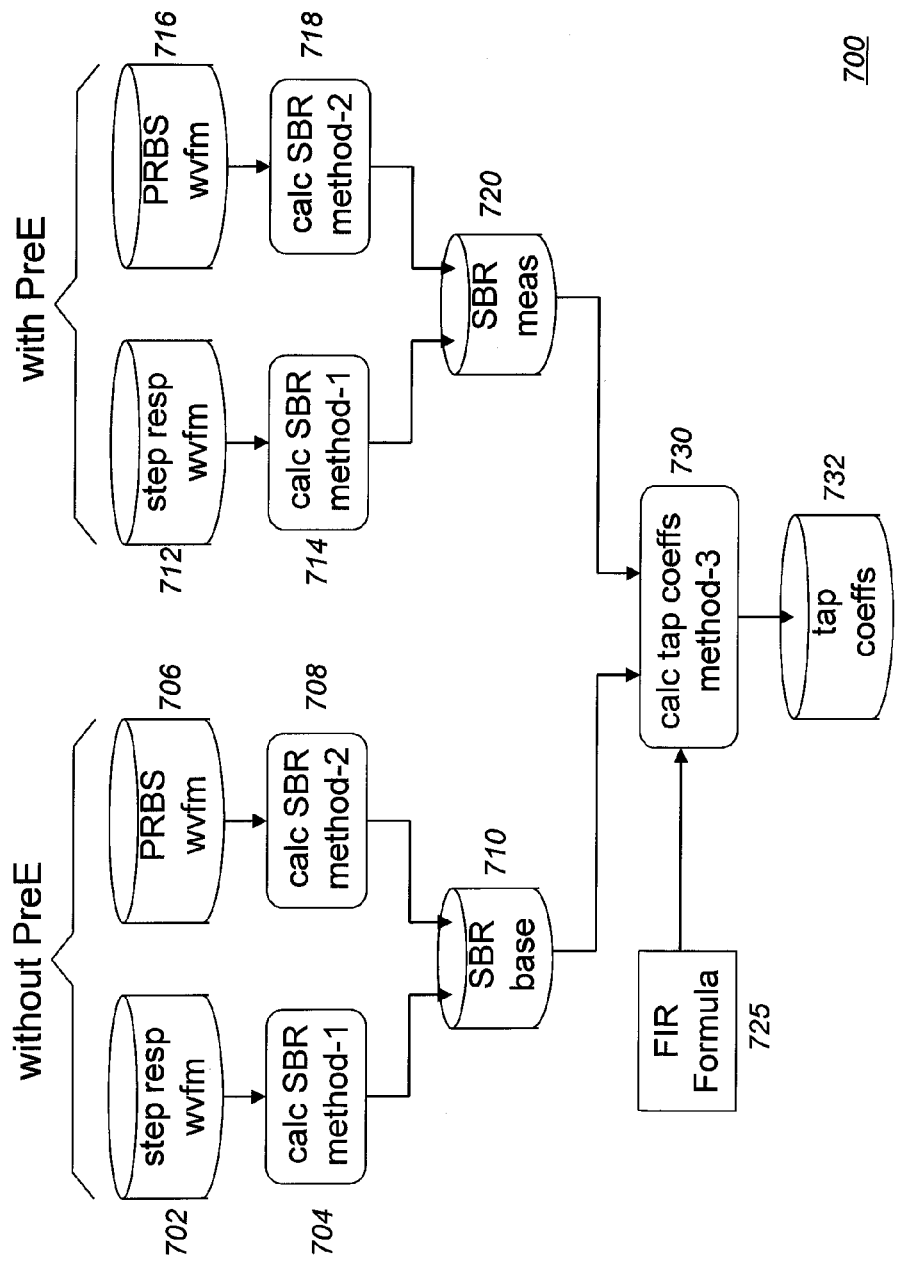
FIG. 7 is a flow diagram of a method of obtaining model parameters for the transmitter modeling in accordance with an embodiment of the invention.

FIG. 7 is a flow diagram of a method 700 of obtaining model parameters for a transmitter in accordance with an embodiment of the invention. The method 700 generates two single-bit response (SBR) waveforms: a "base" SBR waveform; and a "measured" SBR waveform. These two SBR waveforms are used to obtain tap coefficients for the transmitter model.

Base SBR Waveform

As depicted on the left side of FIG. 7, the base SBR waveform may be generated by one of two techniques. Neither of these two techniques applies pre-emphasis before calculating an SBR waveform. Once generated, the base SBR waveform may be stored 710 for subsequent retrieval and use in computing the tap coefficients.

In the first technique, a step response waveform (step resp wvfm) 702 is generated without pre-emphasis applied. The base SBR waveform may then be computed from the step response waveform 702 using a first method (calc SBR method-1) 704 for a given voltage output differential (Vod) and a given data rate.

In accordance with an embodiment of the invention, the first method 704 may compute the base SBR waveform according to the following equation.

$$SBR_{base}(t) = v_{step\_noPreE}(t) - v_{step\_noPreE}(t-T) \quad \text{Eqn. (3)}$$

In the above Eqn. (3), $SBR_{base}(t)$ is the base SBR waveform that is being computed, $V_{step\_noPreE}(t)$ is the observed step response without pre-emphasis, and T is a unit time parameter. The observed step response may be obtained either by computer simulation or laboratory measurement.

In the second technique, a pseudo-random binary sequence waveform (PRBS wvfm) 706 is generated without pre-emphasis applied. The base SBR waveform may then be synthesized from the PRBS waveform 706 using a second method (calc SBR method-2) 708 for a given Vod and a given data rate.

In accordance with an embodiment of the invention, the second method 708 may determine the base SBR waveform according to the following equation.

$$Y_{PRBSwvfm\_noPreE} = P_{SBRwvfm\_base} X_{bitpat} \quad \text{Eqn. (4)}$$

In the above Eqn. (4), $Y_{PRBSwvfm\_noPreE}$ is the observed PRBS waveform without pre-emphasis that is arranged into a matrix, $X_{bitpat}(t)$ is the PRBS bit pattern arranged into a matrix, and $P_{SBRwvfm\_base}$ is the matrix form of the base SBR waveform that is being synthesized. The observed PRBS waveform without pre-emphasis may be either computer simulated or laboratory measured. The below Eqn. (5) shows one solution for computing the base SBR waveform, $P_{SBRwvfm\_base}$. Other solutions are also possible.

$$P_{SBRwvfm} = Y_{PRBSwvfm} X_{bitpat}^T (X_{bitpat} X_{bitpat}^T)^{-1} \quad \text{Eqn. (5)}$$

Measured SBR Waveform

As depicted on the right side of FIG. 7, the "measured" SBR waveform may be created by one (or both) of two techniques. Both of these two techniques apply pre-emphasis before calculating an SBR waveform. Once generated, the measured SBR waveform may be stored 720 for subsequent retrieval and use in computing the tap coefficients.

In the first technique, a step response waveform (step resp wvfm) 712 is generated with pre-emphasis applied. The measured SBR waveform is calculated from the step response waveform 712 using a first method (calc SBR method-1) 714 for a given voltage output differential (Vod) and a given data rate.

In accordance with an embodiment of the invention, the first method 714 may compute the measured SBR waveform according to the following equation.

$$SBR_{meas}(t) = v_{step\_PreE}(t) - v_{step\_preE}(t-T) \quad \text{Eqn. (6)}$$

In the above Eqn. (6), $SBR_{meas}(t)$ is the measured SBR waveform that is being computed, $v_{step\_PreE}(t)$ is the observed step response with pre-emphasis, and T is a unit time parameter.

In the second technique, a pseudo-random binary sequence waveform (PRBS wvfm) 716 is generated with pre-emphasis applied. The measured SBR waveform is synthesized from the PRBS waveform 716 using the second method (calc SBR method-2) 718 for a given Vod and a given data rate. The measured SBR waveform may be stored 720 for subsequent retrieval and use in computing the tap coefficients.

In accordance with an embodiment of the invention, the second method 718 may synthesize the measured SBR waveform according to the following equation.

$$Y_{PRBSwvfm\_PreE} = P_{SBRwvfm\_meas} X_{bitpat} \quad \text{Eqn. (7)}$$

In the above Eqn. (7), $Y_{PRBSwvfm\_PreE}$ is the observed PRBS waveform with pre-emphasis that is arranged into a matrix, $X_{bitpat}(t)$ is the PRBS bit pattern arranged into a matrix, and $P_{SBRwvfm\_meas}$ is the matrix form of the measured SBR waveform that is being synthesized. The observed PRBS waveform with pre-emphasis may be either computer simulated or laboratory measured. The below Eqn. (8) shows one solution for computing the measured SBR waveform, $P_{SBRwvfm\_meas}$. Other solutions are also possible.

$$P_{SBRwvfm\_meas} = Y_{PRBSwvfm\_preE} X_{bitpat}^T (X_{bitpat} X_{bitpat}^T)^{-1} \quad \text{Eqn. 8}$$

Non-Linear Tap Coefficients

Per step 730, the base SBR waveform 710 and the measured SBR waveform 720 are used to determine non-linear tap coefficients 732 for the FIR formula 725 of the pre-emphasis filter 102. The non-linear tap coefficients are determined for a given Vod and a given data rate using a third method (calc tap coeffs method-3) 730. The third method 730 may utilize a minimum mean square error (MMSE) procedure determines the tap coefficients by minimizing the mean square of the difference between the base SBR waveform 710 and the observed SBR waveform 720. The non-linear tap coefficients relate the measured SBR waveform to the base SBR waveform according to the following equation.

$$SBR_{meas}(t) = \sum_i C_i \cdot SBR_{base}(t - i \cdot T) \qquad \text{Eqn. (9)}$$

In Eqn. (9), $SBR_{meas}(t)$ is the measured SBR waveform, $C_i$ is the $i^{th}$ non-linear tap coefficient, and $SBR_{base}(t)$ is the base SBR waveform, and T is the time. In accordance with an embodiment of the invention, the tap coefficients $C_i$ are solved for by minimizing a mean square error between the measured SBR waveform and the summation of the products between the tap coefficients and the time-shifted base SBR waveforms. The tap coefficients may be stored 730 for subsequent retrieval and use in providing more accurate transmitter modeling.

Exemplary Waveforms for First Technique to Synthesize SBR

Figure 8:
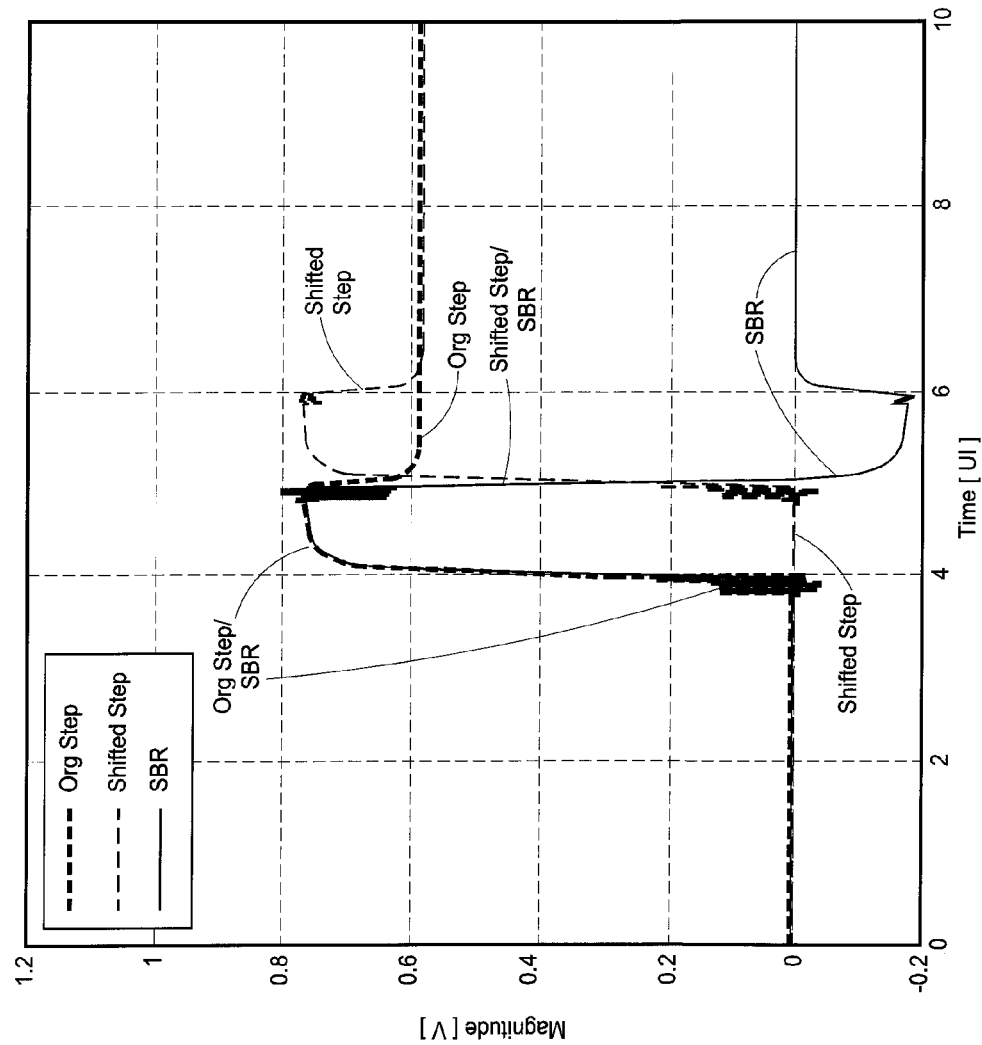
FIG. 8 illustrates a first technique for synthesizing a single-bit response waveform in accordance with an embodiment of the invention.

Exemplary waveforms for the first technique to synthesize a single-bit response (calc SBR method-1) are illustrated in FIG. 8. In particular, FIG. 8 shows an example of the first technique being applied according to Eqn. (6) to synthesize a measured SBR waveform. In FIG. 8, the "Org Step" waveform is an example of an observed step response with pre-emphasis, $V_{step\_PreE}(t)$. The "Shifted Step" waveform is an example of a shifted observed step response, $V_{step\_PreE}(t-T)$. Finally, the "SBR" waveform is an example of the measured SBR waveform, $SBR_{meas}(t)$.

Exemplary Waveforms for Second Technique to Synthesize SBR

Figure 9:
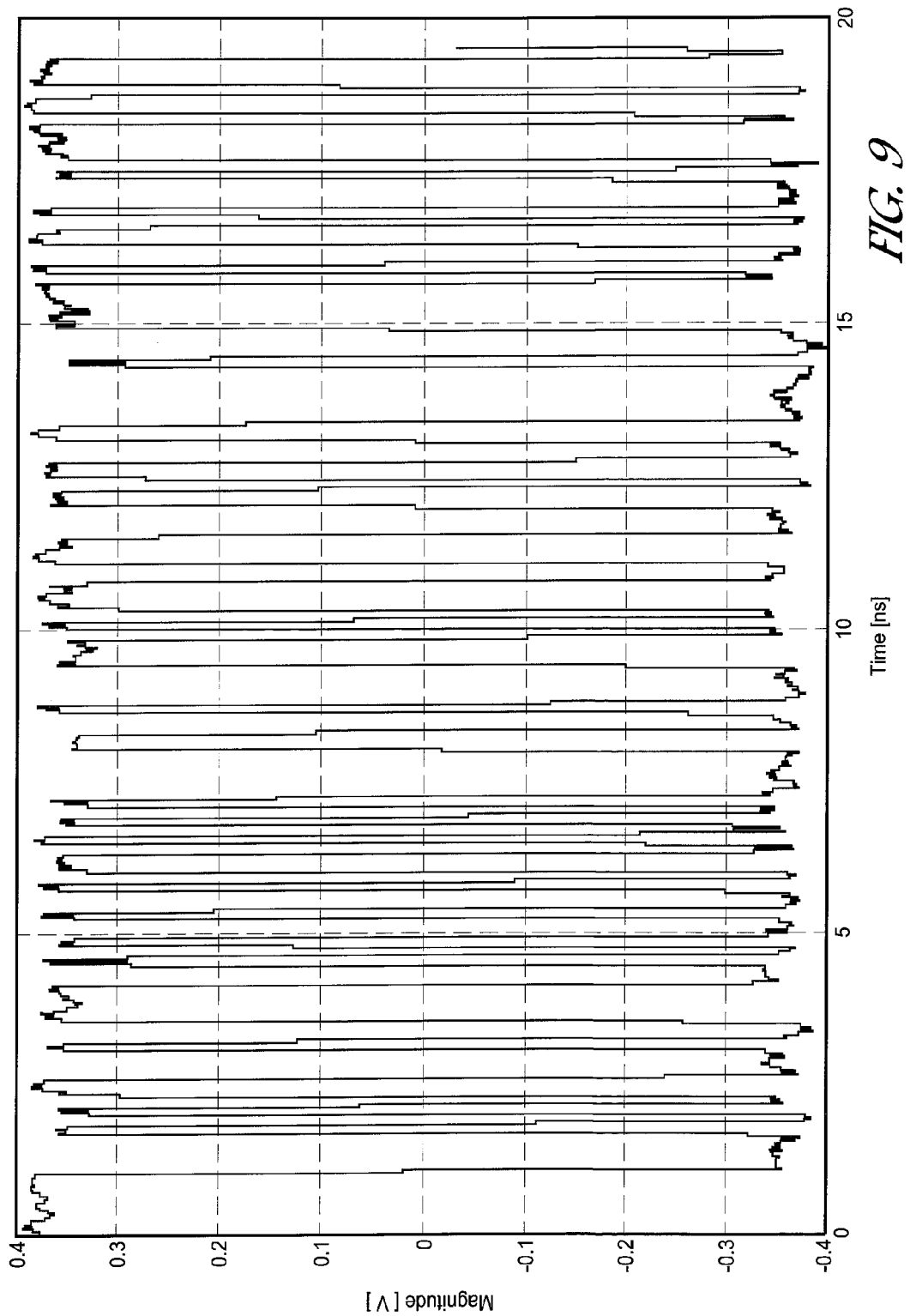
FIG. 9 is a graph depicting a pseudo random binary sequence (PRBS) waveform without pre-emphasis.
Figure 10:
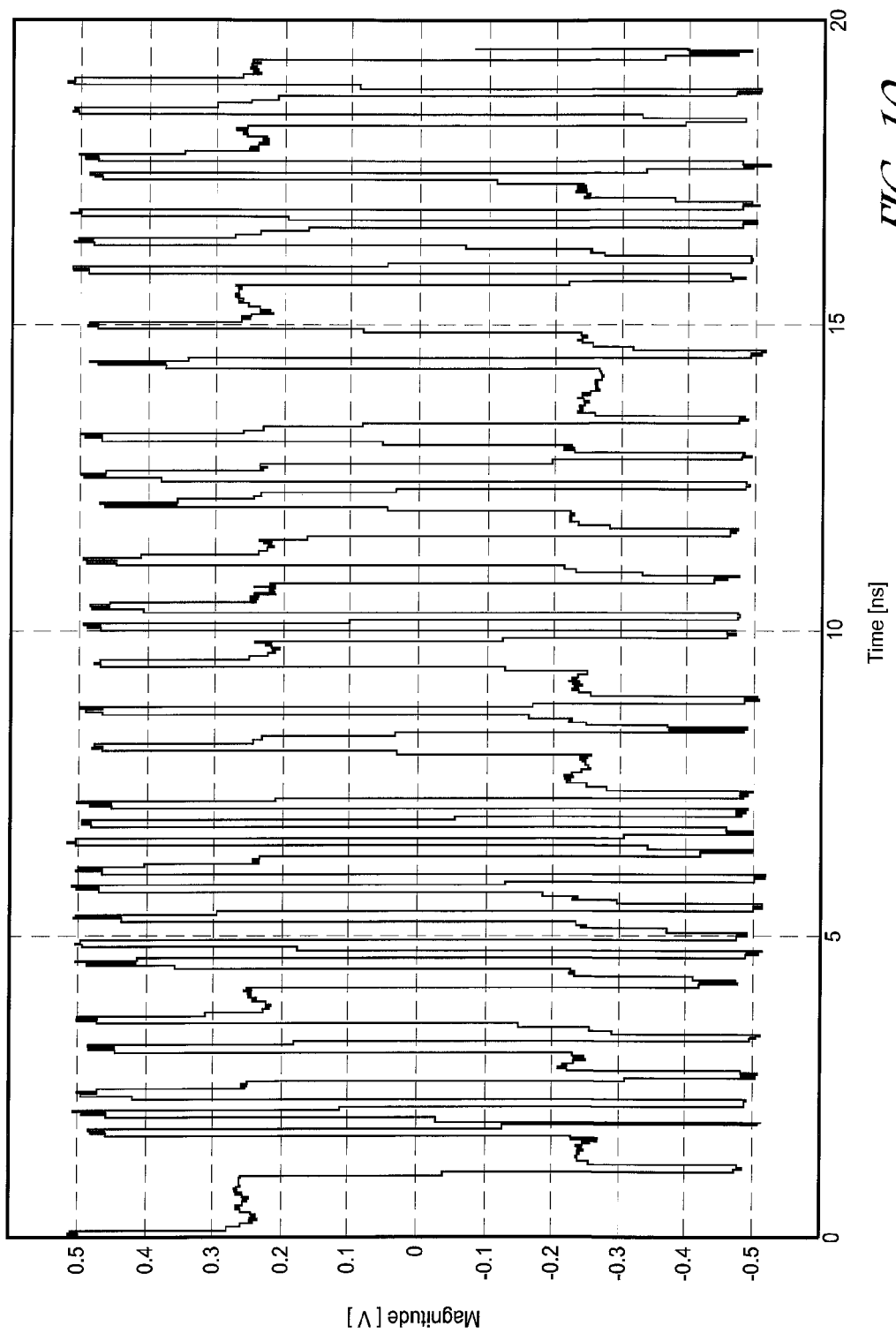
FIG. 10 is a graph depicting the PRBS waveform with pre-emphasis applied thereto in accordance with an embodiment of the invention.

Exemplary waveforms for the second technique to synthesize a single-bit response (calc SBR method-2) are illustrated in FIGS. 9 and 10. FIG. 9 depicts an example of a PRBS waveform without pre-emphasis (PRBS wvfm 706), and FIG. 10 depicts an example of a PRBS waveform with pre-emphasis (PRBS wvfm 716). The example PRBS waveforms in FIGS. 9 and 10 are based on a PRBS7 pattern and may be generated using a linear feedback shift register structure.

Exemplary Waveform Fitting to Obtain Non-Linear Tap Coefficients

Figure 11:
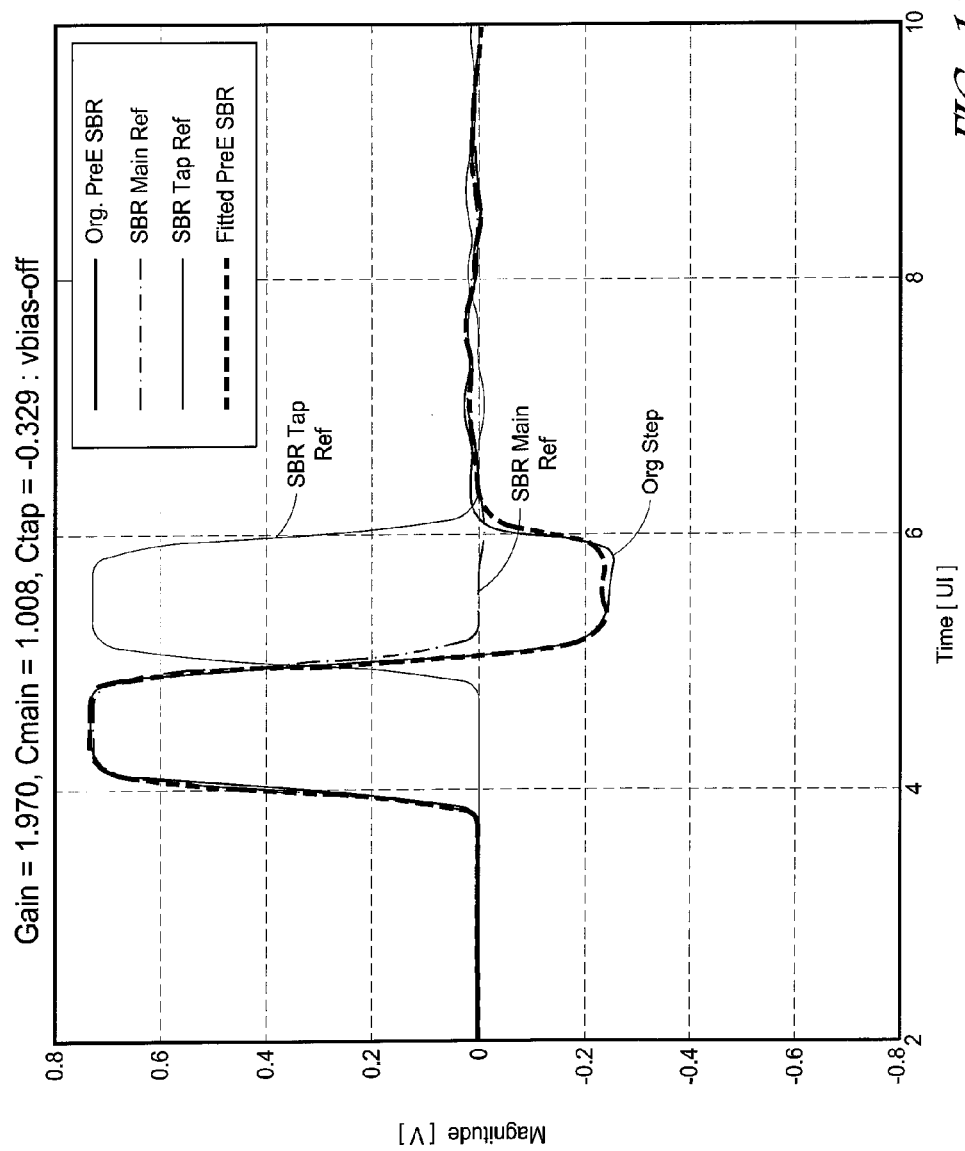
FIG. 11 illustrates a waveform fitting to obtain non-linearity tap coefficients in accordance with an embodiment of the invention.

FIG. 11 illustrates a waveform fitting to obtain non-linear tap coefficients in accordance with an embodiment of the invention. Shown in FIG. 11 is a measured SBR waveform (Org PreE SBR) 720 which was generated with pre-emphasis. Also shown is the base SBR waveform (SBR Main Ref) 710 and the base SBR waveform shifted by one unit time (SBR Tap Ref). SBR Main Ref corresponds to the base SBR waveform with i=0 (i.e. the time-shifted base SBR waveform with zero time shift), and SBR Tap Ref corresponds to the base SBR waveform with i=+1 (i.e. the time-shifted base SBR waveform with shift of positive one unit time). As is described above in relation to Eqn. (9), more than one tap may be used. For instance, the taps may correspond to i=−1, 0, +1, and +2.

Fitting may be performed (calc tap coeffs method-3) 730 to determine the tap coefficients that multiply the base SBR waveforms according to Eqn. (9). The fitting may be implemented using a procedure that minimizes a mean square error between the left and right sides of Eqn. (9). A fitted SBR waveform, formed according to the right side of Eqn. (9), is shown by the dashed line.

Figure 12:
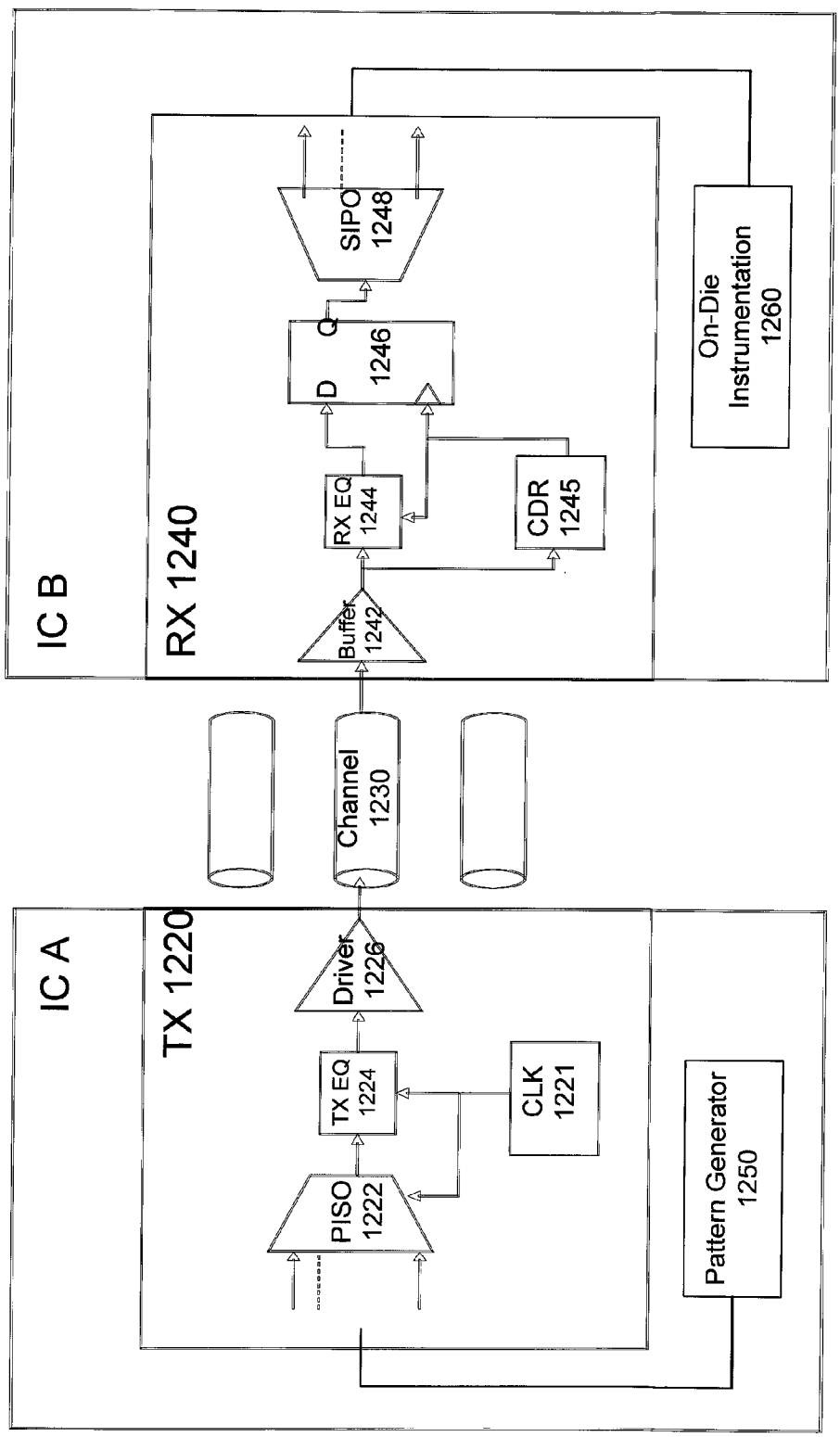
FIG. 12 is a high-level diagram of a data communication link in accordance with an embodiment of the invention.

FIG. 12 is a high-level diagram of a data communication link 1200 which may be optimized in accordance with an embodiment of the invention. As shown in the diagram, the data communication link is generally composed of a transmitter (TX) 1220, a receiver (RX) 1240, and a data communication channel (CH) 1230 that is located in between the transmitter and the receiver.

The TX 1220 may include a parallel-in-serial-out (PISO) circuit 1222. The PISO (serializer) circuit 1222 is configured to receive parallel data signals and convert it to a serial data signal. For example, the transmitter 1220 may be part of an integrated circuit, and the parallel data signals may be provided by a communication protocol module in the integrated circuit.

The serial data signal may be adjusted by a transmitter equalizer (TX EQ) circuit 1224. The TX EQ circuit 1224 may be configured to perform one or more equalizations to compensate for high-frequency signal loss in the channel. Clock generator (CLK) circuit 1221 may utilize a phase locked loop circuit to provide a clock signal to the PISO 1222 and TX EQ 1224 circuits. The output from the TX EQ 1224 circuit may be provided to a driver circuit 1226. The driver circuit 1226 may be configured to transmit the serial data signal over the channel 1230.

The channel 1230 communicates the serial data signal from the transmitter 1220 to the receiver 1240. The channel 1230 may use multiple lanes to communicate the serial data signal.

The receiver 1240 may be configured to receive the transmitted serial data signal from the multiple-lane channel into buffer circuitry 1242. The buffer circuitry 1242 may output the received serial data signal to a receiver equalization (RX EQ) circuit 1244 that may output the equalized signal to a clock data recover (CDR) circuit 1245. The CDR circuit 1245 may use a PLL to recover the clock signal from the serial data signal. The recovered clock signal may be provided to the RX EQ circuit 1244 and to a latch circuit 1246. The RX EQ circuit 1244 may be configured to perform one or more equalizations to compensate for high-frequency signal loss in the channel. More generally, the communication link may perform equalization using either a TX EQ circuit, or a RX EQ circuit, or both TX and RX EQ circuits.

The latch circuit 1246 may be configured to receive the serial data signal from the RX EQ circuit 1244 and to receive the recovered clock signal from the CDR circuit 1245. The latch circuit 1246 outputs the regenerated serial data signal to a serial-in-parallel-out (SIPO) circuit 1248. The SIPO (deserializer) circuit 1248 is configured to receive a serial data signal and convert it to parallel data signals. The parallel data signals may be provided to other circuitry of the receiving device. For example, the receiving device may be an integrated circuit, and the parallel data signals may be provided to a communication protocol module in the integrated circuit.

As further shown in FIG. 12, a pattern generator circuit 1250 may be coupled to the TX 1220. In accordance with an embodiment of the invention, the pattern generator circuit 1250 may be used to generate a data pattern that is transmitted as a serial data signal by the TX 1220 over the channel 1230 to the RX 1240. Performance of the link may be measured using, for example, on-die instrumentation (ODI) 1260.

Figure 13:
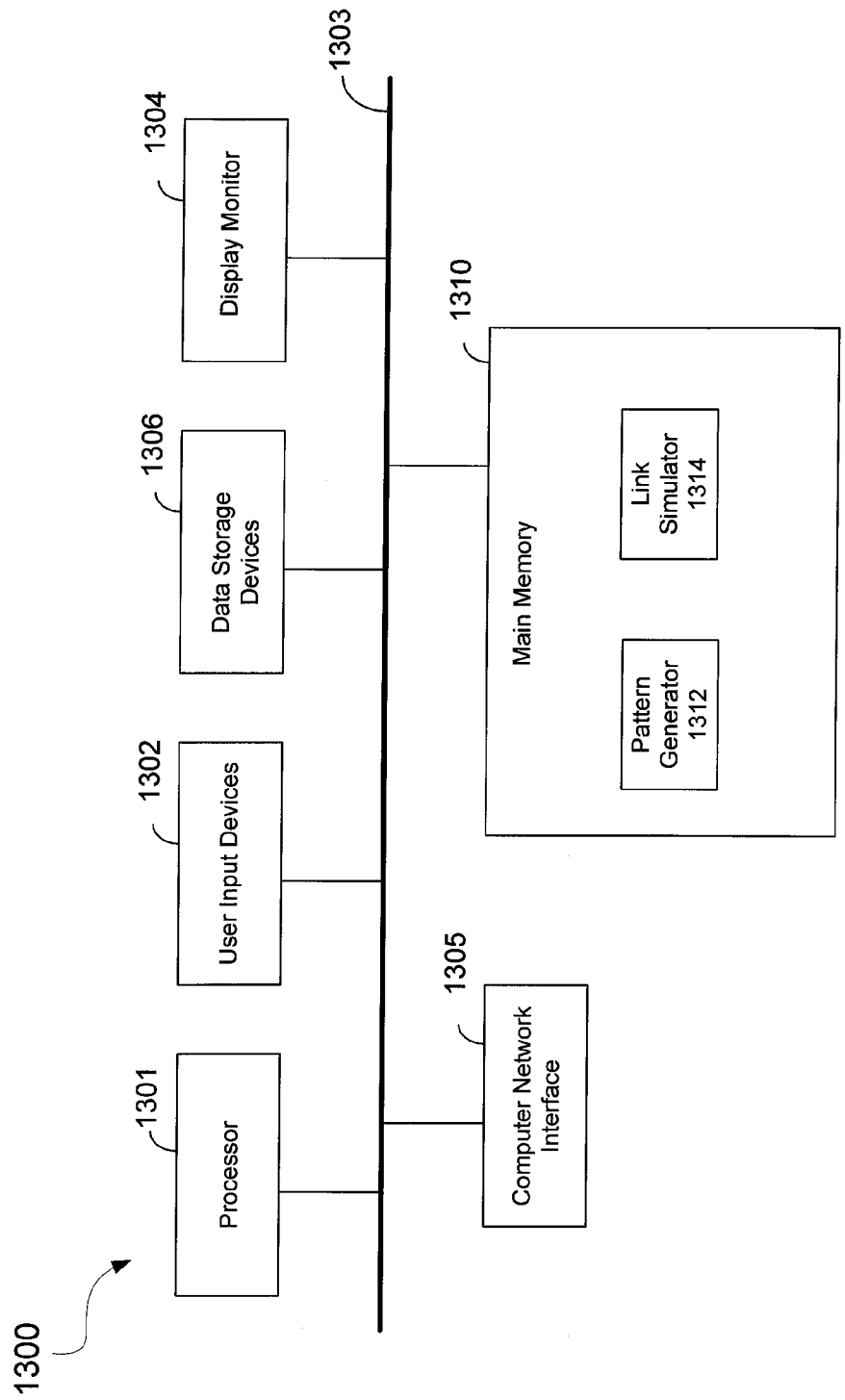
FIG. 13 is a high-level diagram of an example computer apparatus in accordance with an embodiment of the invention.

FIG. 13 is a high-level diagram of an example computer apparatus 1300 in accordance with an embodiment of the invention. The computer apparatus 1300 may be configured with executable instructions so as to perform the data processing methods described herein. This figure shows just one example of a computer which may be used to perform the data processing methods described herein. Many other types of computers may also be employed, such as multi-processor computers, server computers, cloud computing via a computer network, and so forth.

The computer apparatus 1300 may include a processor 1301, such as those from the Intel Corporation of Santa Clara, Calif., for example. The computer apparatus 1300 may have one or more buses 1303 communicatively interconnecting its various components. The computer apparatus 1300 may include one or more user input devices 1302 (e.g., keyboard, mouse), one or more data storage devices 1306 (e.g., hard drive, optical disk, USB memory), a display monitor 1304 (e.g., LCD, flat panel monitor, CRT), a computer network interface 1305 (e.g., network adapter, modem), and a main memory 1310 (e.g., RAM).

In the example shown in this figure, the main memory 1310 includes executable code and data. The executable code may comprise computer-readable program code (i.e., software) components which may be loaded from the data storage device 1306 to the main memory 1310 for execution by the processor 1301. In particular, the executable code may include a data pattern generator module 1312 and a link simulator 1314. In accordance with an embodiment of the invention, the link simulator 1314 may be configured or programmed to model a transmitter as described herein.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An apparatus for generating a data output signal, the apparatus comprising:
    a pre-emphasis filter that receives an input data signal and outputs a pre-emphasized signal;
    an edge-shape filter that receives the pre-emphasized signal and outputs an edge-shaped signal, wherein the edge-shape filter includes
       a non-linearity correction stage that applies a non-linearity correction to the pre-emphasized signal and outputs a non-linearity-corrected signal, and
       a linear filter that applies linear filtering to the non-linearity-corrected signal and outputs the edge-shaped signal; and
    a driver that receives the edge-shaped signal and generates the data output signal.

2. The apparatus of claim 1, wherein a pre-emphasis setting signal is provided to the pre-emphasis filter and the non-linearity correction filter, and
    wherein the non-linearity correction stage applies a pre-emphasis-dependent correction that depends on the pre-emphasis setting signal.

3. The apparatus of claim 1, wherein the non-linearity correction stage applies a correction to the pre-emphasized signal that depends on a soak time of the input data signal.

4. The apparatus of claim 1, wherein the non-linearity correction stage applies a correction to introduce asymmetry between rise time and fall time in the pre-emphasized signal.

5. The apparatus of claim 1, wherein a data rate is input as a parameter to the non-linearity correction filter.

6. The apparatus of claim 1, wherein a voltage output differential parameter is input as a parameter to the pre-emphasis filter, the edge-shape filter, and the driver.

7. The apparatus of claim 1, further comprising:
    stored tap coefficients of the pre-emphasis filter, wherein the tap coefficients are determined using a fitting procedure.

8. The apparatus of claim 7, wherein the stored tap coefficients correspond to tap coefficients for base single-bit response waveforms shifted by −1, 0, +1 and +2 unit times.

9. The apparatus of claim 7, wherein the fitting procedure fits a first waveform to a second waveform, wherein the first waveform comprises a summation of products of the tap coefficients and time-shifted base single-bit response waveforms, and wherein the second waveform comprises a measured single-bit response waveform.

10. The apparatus of claim 9, wherein the fitting procedure minimizes a mean square error between the first and second waveforms.

11. The apparatus of claim 9, wherein the time-shifted base single-bit response waveforms are generated without pre-emphasis applied, and wherein the measured single-bit response waveform is generated with pre-emphasis applied.

12. The apparatus of claim 9, wherein said single-bit response waveforms are generated using pseudo-random binary sequences.

13. A method for generating a data output signal, the method comprising:
    receiving an input data signal by a pre-emphasis filter;
    outputting a pre-emphasized signal by the pre-emphasis filter;
    receiving the pre-emphasized signal by an edge-shape filter;
    applying a non-linearity correction to the pre-emphasized signal by a non-linearity correction stage of the edge-shape filter to generate a non-linearity-corrected signal;
    applying a linear filtering to the non-linearity-corrected signal by a linear filter of the edge-shape filter to generate an edge-shaped signal;
    outputting the edge-shaped signal by the edge-shape filter;
    receiving the edge-shaped signal by a driver; and
    generating the data output signal by the driver.

14. The method of claim 13, further comprising:
    providing a pre-emphasis setting signal to the pre-emphasis filter and the non-linearity correction filter; and
    applying, by the non-linearity correction stage, a pre-emphasis-dependent correction that depends on the pre-emphasis setting signal.

15. The method of claim 13, further comprising:
    applying, by the non-linearity correction stage, a correction to the pre-emphasized signal that depends on a soak time of the input data signal.

16. The method of claim 13, further comprising:
    applying, by the non-linearity correction stage, a correction to introduce asymmetry between rise time and fall time in the pre-emphasized signal.

17. The method of claim 13, further comprising:
    inputting a data rate as a parameter to the non-linearity correction filter; and
    inputting a voltage output differential parameter as a parameter to the pre-emphasis filter, the edge-shape filter, and the driver.

18. The method of claim 13, further comprising:
    determining tap coefficients of the pre-emphasis filter using a fitting procedure; and
    storing the tap coefficients,
    wherein the tap coefficients correspond to tap coefficients for base single-bit response waveforms shifted by −1, 0, +1 and +2 unit times.

19. The method of claim 18, further comprising:
fitting a first waveform to a second waveform by the fitting procedure, wherein the first waveform comprises a summation of products of the tap coefficients and time-shifted base single-bit response waveforms, and wherein the second waveform comprises a measured single-bit response waveform.

20. The method of claim 19, wherein the time-shifted base single-bit response waveforms are generated without pre-emphasis applied, and wherein the measured single-bit response waveform is generated with pre-emphasis applied.

21. The method of claim 20, wherein said single-bit response waveforms are generated using pseudo-random binary sequences.

\* \* \* \* \*